United States Patent
Braneci et al.

(10) Patent No.: US 6,578,171 B1
(45) Date of Patent: Jun. 10, 2003

(54) METHOD OF CORRECTING RESIDUAL ERRORS AT THE OUTPUT OF A TURBODECODER

(75) Inventors: Mohamed Braneci, Rennes (FR); Patrice Nezou, Bruz (FR); Pascal Rousseau, Rennes (FR); Philippe Piret, Cesson-Sevigne (FR); Claude Le Dantec, Saint Hilaire des Landes (FR)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/500,425

(22) Filed: Feb. 9, 2000

(30) Foreign Application Priority Data

Feb. 12, 1999 (FR) .............................. 99 01727

(51) Int. Cl.$^7$ ............................................. H03M 13/00
(52) U.S. Cl. ....................... 714/786; 714/781
(58) Field of Search ......................... 714/786

(56) References Cited

U.S. PATENT DOCUMENTS

| | | | |
|---|---|---|---|
| 4,747,104 A | 5/1988 | Piret | 714/762 |
| 5,446,747 A | 8/1995 | Berrou | 714/788 |
| 5,721,745 A | 2/1998 | Hladik et al. | 714/786 |
| 5,734,962 A | 3/1998 | Hladik et al. | 455/12.1 |
| 6,023,783 A | * 2/2000 | Divsalar et al. | 714/792 |
| 6,163,873 A | * 12/2000 | Murano | 714/782 |
| 6,334,197 B1 | * 12/2001 | Eroz et al. | 714/701 |
| 6,370,669 B1 | * 4/2002 | Eroz et al. | 714/774 |

FOREIGN PATENT DOCUMENTS

| | | | |
|---|---|---|---|
| EP | 0205667 | 12/1986 | H03M/13/00 |
| EP | 0511141 | 10/1992 | H03M/13/12 |
| EP | 0820159 | 1/1998 | H04B/7/185 |
| WO | 97/40582 | 10/1997 | H03M/13/00 |

OTHER PUBLICATIONS

Oberg et al., Parity Check Codes for Partial Response Channels. 1999, p. 217–222.*
Burkert et al., Turbo decoding with Unequal error protection applied to GSM speech coding, IEEE, p. 2044–2048, 1996.*
Berrou et al., WP 5.7: An IC for Turbo–codes encoding and decoding, IEEE, p. 90–91, 1995.*
Pyndiah, Near_optimum decoding of product codes:block turbo codes, IEEE, p. 1003–1010, Aug. 1998.*
Anderson, Turbo coding for deep space application, IEEE, p. 36.*
Berrou, Near Optimal error correcting coding and decoding: turbo codes, IEEE, p. 1261–1271, 1996.*
Berrou et al., Near Shannon Limit Error–correcting coding and decoding: Turbo–codes, IEEE, p. 1064–1070, 1993.*

* cited by examiner

Primary Examiner—Albert Decady
Assistant Examiner—Shelly A Chase
(74) Attorney, Agent, or Firm—Fitzpatrick, Cella, Harper & Scinto

(57) ABSTRACT

A method of transmitting binary data by a sender to a receiver over a transmission channel includes a formatting function integrated with a function of external coding of the binary data. The method applies in particular to the case where the sender uses a turbocoder with an interleaver of the "x to $x^e$" type, and where the receiver uses a turbodecoder with an interleaver of the "x to $x^e$" type.

32 Claims, 6 Drawing Sheets

|   | 1 |   |   |   |   |   | $N_o$ |
|---|---|---|---|---|---|---|---|
| 1 | 0 | 1 | 2 | 3 | 4 | 5 | 6 |
|   | 7 | 8 | 9 | 10 | 11 | 12 | 13 |
|   | 14 |   |   |   |   |   |   |
|   | 21 |   |   |   |   |   |   |
|   | 28 |   |   |   |   |   |   |
|   | 35 |   |   |   |   |   |   |
|   |   | ... | ... |   | ... | ... |   |
|   | 133 |   |   |   |   |   |   |
| M | 140 | 141 | 142 | 143 | 144 | 145 | 146 |

METHOD OF CORRECTING RESIDUAL ERRORS AT THE OUTPUT OF A TURBODECODER

BACKGROUND OF THE INVENTION

Field of the Invention

The invention lies in the general field of communication systems. It concerns in particular an external code which permits the correction of residual errors at the output of a turbodecoder, taking account of the constraints imposed by the use of a turbocode in general terms, and more particularly a turbocode based on an interleaver of the so-called "x to $x^e$" type.

It applies equally well to the coding of data representing a physical quantity, to the coding of data in the form of codes able to modulate a physical quantity, to the decoding of data-modulated signals as data, and to the decoding of data representing physical quantities. These data can, for example, represent images, sounds, computer data, electrical quantities or stored data.

SUMMARY OF THE INVENTION

The invention finds an application in the field of convolutional codes. When the latter are used to implement an iterative decoding, these codes are greatly improved when their coders contain a permutation device ("interleaver"). In this case, they are normally referred to as "turbocodes" and the corresponding iterative decoder is referred to as a "turbodecode". For convenience.

the operation performed by the turbocoder is referred to as a "turbocoding" and this operation supplies a so-called "turbocoded" sequence.

the operation performed by the turbodecoder is referred to as "turbodecoding" and this operation supplies a so-called "turbodecoded" sequence.

On these subjects, documents which serve as a reference are, on the one hand, the article by C. BERROU, A. GLAVIEUX and P. THITIMAJSHIMA entitled "*Near Shannon limit error-correcting coding and decoding:turbocodes*" published in the proceedings of the conference ICC'93. 1993, pages 1064 to 1070, and on the other hand the article by C. BERROU and A. GLAVIEUX entitled "*Near optimum error-correcting coding and decoding:turbo-codes*" published in IEEE Transactions on Communications, Volume 44, pages 1261 to 1271, in October 1996.

A parallel turbocoder (FIG. 1) with an efficiency equal to ⅓ can be considered as a pair of systematic recursive convolutional coders with divisor polynomials such that the first coder 120 produces a check sequence from the sequence of symbols to be coded $\underline{a}$ and the second coder 122 produced a check sequence of a sequence $\underline{a}^*$ obtained by interlacing (or "permutation" in an interleaver 121) of the sequence $\underline{a}$.

In this context, the simultaneous return to zero of the two codes is a classic problem.

One way of resolving it has been found by one of the inventors and is summarised below.

For the purpose of clarity, it will be assumed hereinafter that the two divisor polynomials of the turbocoder are equal and termed g(x). Let m be the degree of the polynomial g(x) and let $N_0$ be the smallest integer such that g(x) is a divisor of the polynomial $1+x^{N_0}$.

For reasons described below, a polynomial g(x) is chosen where no divisor is the square of a polynomial of degree equal to or greater than 1, and this means that $N_0$ is an odd number.

Let N be the size of the sequence $\underline{a}$ chosen so that it is an odd multiple of $N_0$: $N=M \cdot N_0$.

Any sequence of information symbols $\underline{a}$ for being turbocoded can then have a polynomial representation u(x) with binary coefficients of degree N-m-1. This sequence u(x) is precoded (or "formatted") as:

$$a(x) = u(x) + \sum_{i=N-m}^{N-1} a_i x^i$$

where the m binary symbols $a_1$ are chosen so that a(x) is a multiple of g(x). As a consequence of this formatting (preceding) and the chosen values of the parameters, if a(x) is a multiple of g(x), then $a^*(x)=a(x^e)$ modulo $1+x^N$ is also a multiple of g(x) for any value of e which is a power of 2. It is necessary to consider that g(x) has no multiple factor since, in general, $a^*(x)$ has the guarantee of being divisible only by the irreducible factors of g(x).

In the remainder of the description, the type of permutations and interleavers disclosed above are referred to as "x to $x^e$".

With general turbocodes, decoding is essentially an iterative procedure (see in this regard the document by C. BERROU and A. GLAVIEUX, "*Near optimum error-correcting and decoding:turbocodes*", IEEE Trans. On Comm., Vol. COM-44, pages 1261–1271, October 1996).

Two prior-art documents have a few points of similarity with the problem to be resolved with regard to the correction of residual errors at the output of a turbodecoder.

A patent U.S. Pat. No. 4,276,646 of Texas Instruments describes a method and device for detecting and correcting errors in a set of data. In this patent a method is described consisting of putting the information in the form of subsets and adding to each subset a CRC (Cyclic Redundancy Check) so as to correct said subset.

An article by J. Andersen ("*Turbocoding for deep space applications*", Proc. IEEE 1995 International Symposium on Information Theory, Whistler, Canada, September 1995) proposes the use of a BCH code for the correction of residual errors at the output of a turbodecoder.

These two documents present solutions which have a fairly limited effectiveness in the correction of residual errors, notably if they are applied to turbocodes of the type "x to $x^e$". There are two main reasons for this:

The first reason relates to the fact that they do not take account of the structure of the residual errors. In fact a study of turbodecoders with an interleaver of the type "x to $x^e$", by one of the inventors, revealed that the residual errors have a particular structure, provided that the iterations of the decoder are continued until their results stabilises.

The second reason is that the solutions proposed above supply coded sequences whose associated polynomial is not divisible by the divisor polynomial g(x) (their outputs are not formatted). A formatting function is therefore necessary before turbocoding.

The aim of the invention is therefore to remedy the aforementioned drawbacks in efficacy of residual error correction at the output of a turbodecoder.

To this end the invention proposes a method of transmitting binary data $\underline{u}$ by a sender to a receiver through a transmission channel, characterised in that said method includes a formatting function integrated in an external coding function for the binary data $\underline{u}$.

This invention can be used in many telecommunication systems.

It applies in particular in cases where the sender uses a turbocoder with an "x to $x^e$", interleaver, and the receiver uses a turbocoder with an "x to $x^e$" interleaver.

According to an even more particular embodiment, the binary data u are stored in an initial matrix U of L rows and K columns, L and K being predetermined, and an error correction code ($N_0$, K) is allocated to each row, thus forming an intermediate matrix U1.

According to an even more particular embodiment, an error detection code (M, L) is allocated to each column of the intermediate matrix U1, thus forming a formatted matrix A, having M rows and $N_0$ columns.

This arrangement makes it possible to detect the columns in error, on the principle of a product code.

According to a more particular embodiment, the error detection code (M, L) is produced by adding five additional bits calculated with the generator polynomial $g_1(y)=(1+y)(1+y^4)$, where $y=x^{N_0}$, $N_0$ being the number of columns in said formatted matrix A.

It will be understood that y is a binary variable evaluated along the columns of the matrix A.

The term (1+y) of the generator polynomial $g_1(y)$ ensures that the coding of the binary data u by the codes ($N_0$, K) and (M, L) supplies a sequence which is divisible by the polynomial g(x). The term $(1+y+y^4)$ is an example of a polynomial used for error detection.

In a particular implementation, the error correction code ($N_0$, K) has a minimum distance (d) greater than a predetermined number, representing the number of columns which can be corrected by the received matrix A'.

The invention also relates to a method of formatting binary data for a transmission method according to the invention, said formatting method being implemented by a central unit, using data (M, $N_0$, L, K) previously stored in a non-volatile memory, and being characterised in that it includes the following steps.

receiving binary data u transmitted by a source, storing data row by row in an initial matrix U of L rows and K columns, coding each row of the initial matrix U with the code ($N_0$, K), thus forming an intermediate matrix U1.

The formatting method then preferentially also includes the following steps:

coding each column of the intermediate matrix U1 with the code (M, L), thus forming a formatted matrix A, of size M x $N_0$ reading the matrix A row by row, and generating a sequence a, sent to the turbocoder.

The invention also relates to a method of decoding data received over a transmission channel, for a transmission method as disclosed above, said decoding method being implemented by a central unit, using data (M, $N_0$, L, K, g, g1) previously stored in a non-volatile memory, and being characterised in that it uses a method of recovering data in whole columns.

The invention also relates to a method of decoding data received over a transmission channel, for a transmission method according to the above disclosure, said decoding method being implemented by a central unit, using data (M, $N_0$, L, K) previously stored in a non-volatile memory, and being characterised in that it includes the following steps:

receiving binary data ã supplied by a turbodecoder, storing data row by row in a received matrix A' of M rows and $N_0$ columns, decoding each column j of the received matrix A' with the code (M, L), and erasing the column j if an error is detected, thus forming a received intermediate matrix U1' of size L x $N_0$.

The decoding method then preferentially also includes the following steps:

decoding each row i of the received intermediate matrix U1' with the erasure decoder ($N_0$, K), thus forming a received final matrix U' of size L x K, reading the received final matrix U' row by row, and generating the sequence û, sent to a destination.

The invention relates in another aspect to a device for transmitting binary data u including a sender, a receiver, characterised in that said device has means adapted to effect, in an integrated fashion, a formatting function and a function of external coding of the binary data u.

According to a preferred arrangement, the sender has a turbocoder with an "x to $x^e$" interleaver, and the receiver has a turbocoder with an "x to $x^e$" interleaver.

According to a preferred embodiment, the device has means of storing the binary data u in a matrix of L rows and K columns, L and K being predetermined, and of allocating an error correction code ($N_0$, K) to each row and an error detection code (M, L) to each column The invention also relates to a network, a computer, a video-camera, a facsimile machine, a photographic apparatus, a television receiver, a printer, a scanner and an audio/video player, characterised in that they have a device as succinctly disclosed above.

The invention also relates to:

an information storage means which can be read by a computer or microprocessor storing instructions of a computer program characterised in that it makes it possible to implement the method of the invention as succinctly disclosed above, and an information storage means which is removable, partially or totally, and which can be read by a computer or microprocessor storing instructions of a computer program characterised in that it makes it possible to implement the method of the invention as succinctly disclosed above, and an information storage means containing data resulting from the implementation of the method of the invention as briefly discussed above.

The advantages of this device, this network, this computer, this camera, this facsimile machine, this photographic apparatus, this television receiver, this printer, this scanner, this audio/video player and these storage means being the same as those of the method as succinctly disclosed above, they are not repeated here.

BRIEF DESCRIPTION OF THE DRAWINGS

The following description and drawings will give a better understanding of the aims and advantages of the invention. It is clear that this description is given by way of example, and has no limitative character. In the drawings:

FIG. 3 shows the organisation of the sequence a with the corresponding binary weights in a matrix for $N_0=7$ and M=21;

FIG. 4 shows a typical example of residual errors, in the same case $N_0=7$ and M=21;

DETAILED DESCRIPTION OF THE INVENTION

Figure 1:
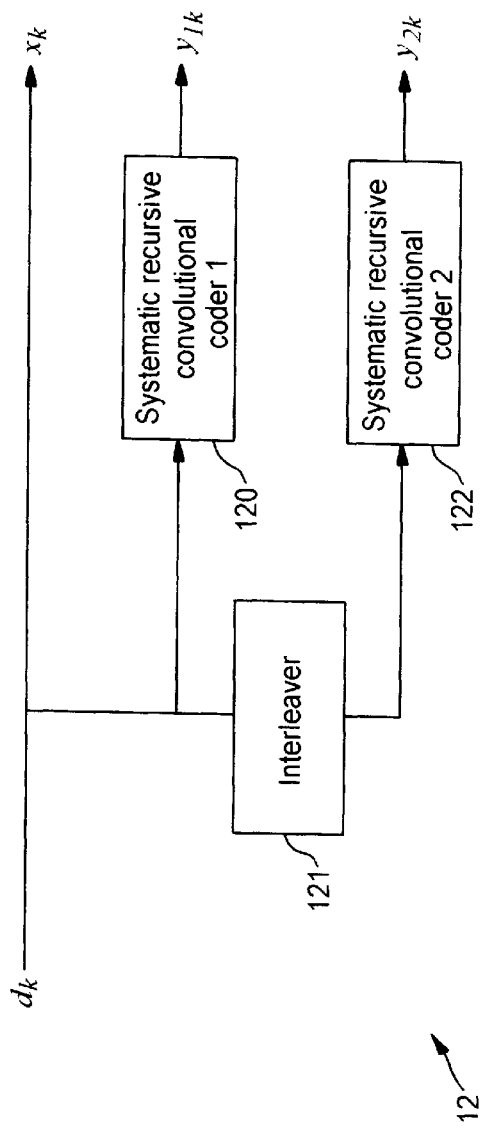
FIG. 1 is a functional diagram of a turbocoder.
Figure 2:
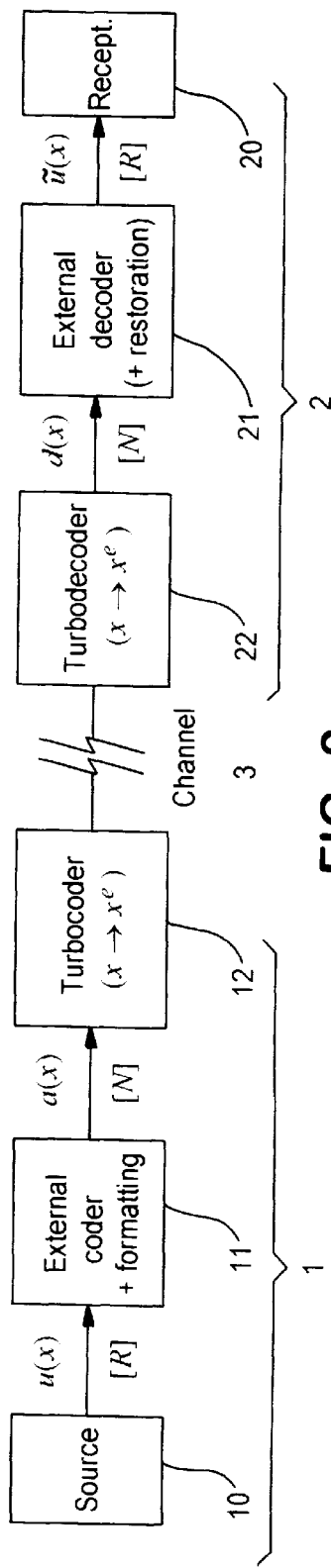
FIG. 2 is a functional diagram of a communication system using turbocodes an "x to $x^e$" interleaver with concatenation of codes for the correction of residual errors.

In general terms, the invention is intended to fit within a communication system having a sending part 1 and or a receiving part 2, these parts being connected by a transmission channel 3, possibly noisy and therefore a source of errors for the received signal (FIG. 2).

In order to take account of these possible transmission errors, and nevertheless arrive at a correct transmission of the initial data, error correction and detection codes are inserted in the signal sent in order to correct the transmission errors.

In the particular case of the invention, the sending 1 and receiving 2 parts use devices known to persons skilled in the art as a turbocoder 12 and turbodecoder 22. More precisely, they use a turbocoder 12 and turbodecoder 22 with interleavers of the type "x to $x^e$" described above.

Before describing a particular embodiment of the present invention, we give below a mathematical presentation of its functioning.

It should be stated here that it has been assumed that the two divisor polynomials of the turbocoder 12 are equal and termed g(x). Let m be the degree of the polynomial g(x) and let $N_0$ be the smallest integer such that g(x) is a divisor of the polynomial $1+x^{No}$.

A polynomial g(x) is chosen, no divisor of which is the square of a polynomial of degree equal to or greater than 1, and this means that $N_0$ is an odd number.

As stated, the invention proposes an external coding which integrates the formatting function and is adapted to a particular structure of the residual errors at the output of the turbodecoder 22.

This particular structure is described below.

Let $\hat{a}$ be the estimated version of the sequence $\underline{a}$ at the output of the turbodecoder 22. Writing the sequence $\hat{\underline{a}}$ row by row in a formatted matrix A' of M rows and $N_0$ columns (FIG. 3 shows the order of writing in the matrix for M=21 and $N_0$=7), the structure of the errors processed by the present invention is as follows:

the errors are grouped in pairs in the direction of the columns and are distributed over a small number of columns (typically 1 column) (FIG. 4 gives a typical example for M=21 and $N_0$=7).

As can be seen in FIG. 2, which shows a functional diagram of a device with concatenation of codes for the correction of residual errors, in the sending part 1, a source 10 supplies a sequence of binary information items $\underline{u}$ of size R=N-m. Before turbodecoding, these data are coded and formatted in a sequence $\underline{a}$ of size N, equivalent to a matrix A.

On reception, the reverse operations are performed in order to give successively an estimated version $\hat{\underline{a}}$ of the sequence $\underline{a}$, and then an estimated version $\hat{\underline{u}}$ of the information sequence $\underline{u}$.

The concentration of the residual errors over few columns in the received matrix A' then suggests a method of recovery by full columns. Because of this, in the formatted matrix A, an error correction code is allocated to each row and a CRC (error detection code) is allocated to each column in order to allow detection of the columns in the received matrix A' having at least one error, on the principle of a product code.

The location of the columns in error makes it possible to increase the capacity of the correction code, which can therefore be a code of very low complexity.

Two codes are therefore defined:

1/ an error correction code ($N_0$, K) applied to each row in the initial matrix U, 2/ an error detection code (M, L) applied to each column in the intermediate matrix U1 thus obtained.

Figure 5:
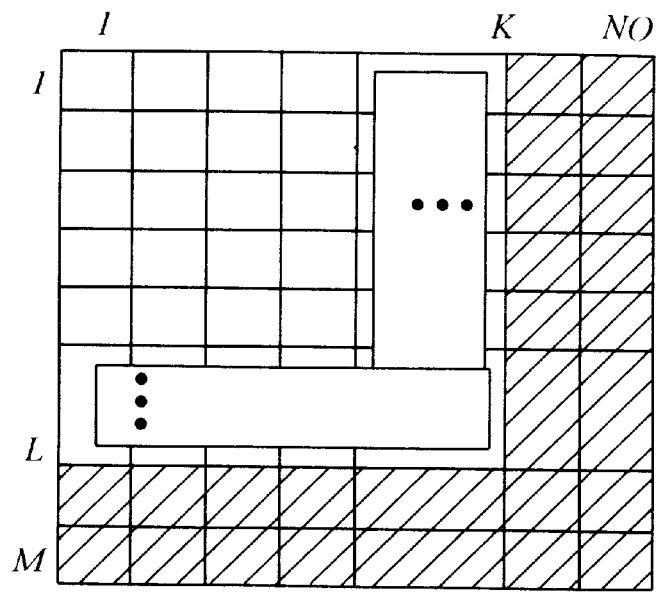
FIG. 5 illustrates an external coding applied to a matrix U with K columns and L rows.

FIG. 5 illustrates these two external codings, with the $N_0$-K additional columns (compared with the initial matrix U) added on the right at the end of each row in the matrix A, and the M-L added rows (compared with the intermediate matrix U1) at the end of each column. The values of K and L are determined by the choice of the corresponding codes.

The choice of each of the two codes is given below.

First of all it should be noted that the organisation of the data $\underline{a}$ in a formatted matrix A having M rows and $N_0$ columns (matrix M x $N_0$) also makes it possible to write the polynomial a(x) in the following forms:

$$a(x) = \sum_{j=0}^{N0-1} \sum_{i=0}^{M-1} a_{iN0+j} x^{iN0+j} = \sum_{j=0}^{N0-1} c_j(x^{N_0}) \cdot x^j = \sum_{i=0}^{M-1} d_i(x) \cdot x^{iN0},$$

with:

$$c_j(x) = \sum_{i=0}^{M-1} a_{iN0+j} x^i$$

the polynomial correspondent to the column j, and $$d_i(x) = \sum_{j=0}^{N0-1} a_{iN0+j} x^j$$

the polynomial corresponding to the row i.

If $y=x^{No}$, then $$a(x) = \sum_{j=0}^{N0-1} c_j(y) \cdot x^j$$

On reception, each column of the received matrix A' can be expressed by $p_j(y)=c_j(y)+e_j(y)$, where $e_j(y)$ is an error polynomial on the column j.

Let it be assumed that their exists w pairs of errors at positions $p_., p_2, \ldots, p_w$, the polynomial $e_j(y)$ can then be written:

$$e_j(y)=y^{p1}(1+y)+y^{p2}(1+y)+\ldots +y^{pw}(1+y)=(1+y),e'_j(y)$$

where the polynomial $e'_j(y)$ represents the singular errors (single errors) on the column j.

It should be noted that dividing each polynomial associated with a column by (1+y) divides the number of errors by two, reducing all the pairs of errors into singular errors.

One bit is therefore reserved on each column of the formatted matrix A in order to ensure divisibility of the polynomial associated with each column in the formatted matrix A by (1+y). This bit also allows the detection of an odd number of errors, but it remains insufficient in this precise case of pairs of errors.

In order to increase the detection capacity of the code, one or more additional bits must be reserved for detection on each column of the matrix A.

In the description given here by way of non-limitative example, four additional bits are reserved for detection and are calculated using the generator polynomial: $1+y+y^4$.

In this case, there is applied to each column in the intermediate matrix U1 the code (M, L=M−5) having as generator polynomial: $g_1(y)=(1+y)(1+y+y^4)$, which amounts to stating that five lines at the bottom of the matrix U1 are added, thus forming the formatted matrix A.

In addition to the detection function, this choice of coding on the columns gives rise to an important property on the divisibility of the polynomial $a(x)$ by $g(x)$; this property is demonstrated below.

It has been seen that $$a(x) = \sum_{j=0}^{N_O+1} c_j(y) \cdot x^j$$

with $y=x^{N_O}$.

It can be seen that, for $a(x)$ to be divisible by $g(x)$ it suffices for $c_j(y)$ to be divisible by $g(x)$. According to the construction of the code (M, L), $c_j(y)$ is divisible by $(1+y)$ and therefore by $(1+x^{N_O})$, or by hypothesis $g(x)$ divides $(1+x^{N_O})$, and consequently $c_j(y)$.

In summary, the fact that the polynomial associated with each column ($c_j(y)$) is divisible by $(1+y)$ ensures that the polynomial $a(x)$ is divisible by $g(x)$.

This is an important property which enables the external code to implicitly ensure the divisibility of the polynomial $a(x)$ by the polynomial $g(x)$.

This justifies the advantage of the combination of the data formatting function with the external coding, which thus affords a significant gain in useful output and in simplicity of processing.

When errors are detected in a column of the received matrix A' by the code (M, L), the entire column is erased since the position of the errors is unknown. The code ($N_0$, K) is used as an erasure decoder solely.

Let d be the minimum distance of the code ($N_0$, K). If it is assumed that there are only erasures on each row, this code permits the correction of at most d−1 columns. The choice of the code ($N_0$, K) therefore depends on the degree of reliability which it is wished to have.

A few examples of codes having different correction capacities or efficiencies are given below:

With a code XOR ($N_0$, $N_0$−1), 1 column can be corrected, and the efficiency is ($N_0$−1)/$N_0$.

With a Hamming (7, 4) code, 2 columns can be corrected, and the efficiency is 0.57.

With a Reed-Solomon (7, 5) code, 2 columns can be corrected, and the efficiency is 0.71.

With a Hamming (15, 11) code, 2 columns can be corrected, and the efficiency is 0.73.

A first example of a simple code is the coding XOR ($N_0$, $N_0$−1) which permits recovery of a single erased column. In this case, for the coding operation, the elements of the last column in the formatted matrix A (matrix of size M x No) are calculated as follows:

$$a_{iN_O+N_O-1} = \sum_{j=0}^{N_O-2} a_{iN_O+j}$$

for $0 \leq i < L$

If $j_e$ is the position of the erased column, recovery of the elements of this column is effected by;

$$a_{iN_O+je} = \sum_{\substack{i=0 \\ j \neq je}}^{N_O-1} a_{iN_O+j}$$

for $0 \leq i < L$

A second example is that of the Reed-Solomon (7, 5) code on the eight-element Galois field GF(8). For a correction capacity identical to the Hamming (7, 4) code, this code has a better efficiency. This code uses three-bit symbols. To have a code word length of 7, each symbol is coded in three rows of the seven-column matrix.

Figure 6:
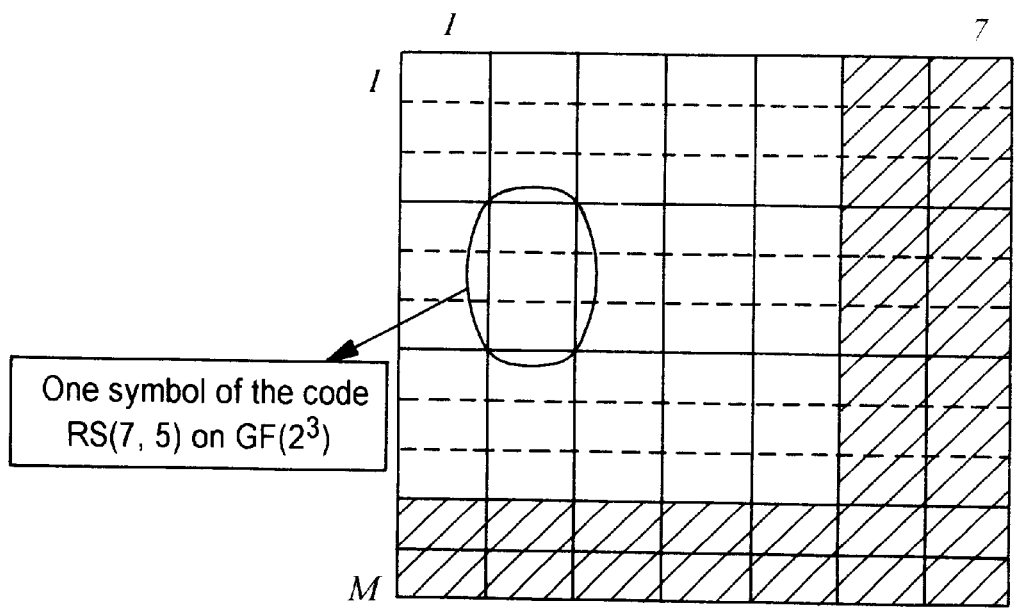
FIG. 6 illustrates an example of Reed-Solomon (7, 5) row coding on GF(8)

FIG. 6 therefore illustrates an example of Reed-Solomon (7, 5) row coding on GF(8).

The technical considerations disclosed above are independent of the efficiency of the turbocode and can consequently be applied both to convolutional turbocodes with an efficiency less than or equal to ⅓ or to convolutional turbocodes with an efficiency greater than ⅓.

The description of a particular embodiment of the present invention will now be continued with regard to FIGS. 7 to 10. In this description, the transmission channel used is of the half-duplex type. However, persons skilled in the art can without difficulty implement the invention in the case of a full-duplex channel.

Figure 7:
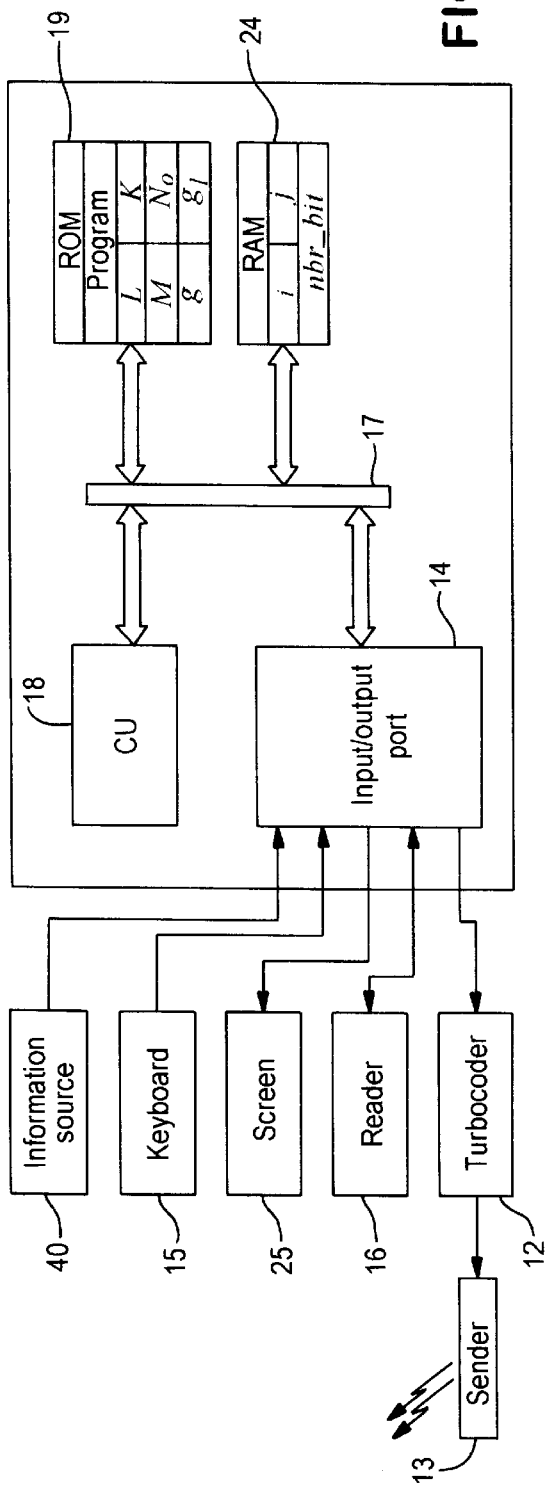
FIG. 7 depicts, schematically, an electronic device incorporating the coder.

FIG. 7 depicts a sending electronic device, incorporating a turbocoder 12. In such a device, a source 10 supplies an input/output port 14, conjointly with a keyboard 15 and a storage device reader (for example a removable disk drive) 16. The input/output port 14 is connected by a bus 17 of a conventional type to a central unit 18, to a non-volatile information storage device (ROM) 19, and to a volatile memory device 24 (RAM). A screen 25, connected to the input/output port 14, allows the display of data for the user. The input/output port 14, the bus 17, the central unit 18 and the storage devices 19, 20 are typically integrated into a microcomputer casing of a conventiorial type.

The input/output port 14 is finally connected to the turbocoder 12 which itself supplies a sender 13 of a known type.

The non-volatile memory 19 is adapted to store on the one hand instructions of a computer program for implementing the method of transmitting binary data, the method of formatting binary data and the coding method according to the invention, and on the other hand the coding data (L, K, M, $N_0$, g, g1) characteristic of the coding type previously chosen.

This non-volatile memory 19 is read by the processor of the control unit 18. According to a variant, the non-volatile memory means 19 is removable, partially or totally, and is for example a magnetic tape, a floppy disk or a fixed-memory compact-disc (CD-ROM).

The volatile memory 24 is adapted to store information on position in a matrix (i, j) and on the number of bits (nbr_bit).

In general terms, the volatile memory 24 contains data resulting from the implementation of the method according to the invention.

Figure 8:
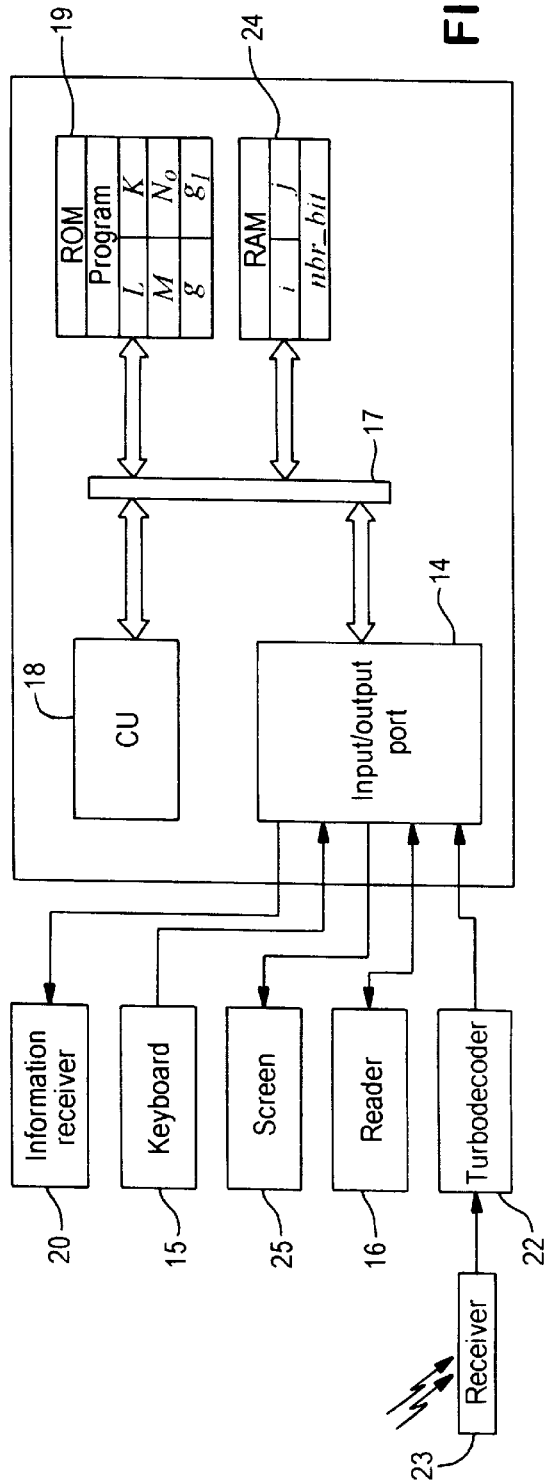
FIG. 8 depicts, schematically, an electronic device incorporating the decoder.
Figure 9:
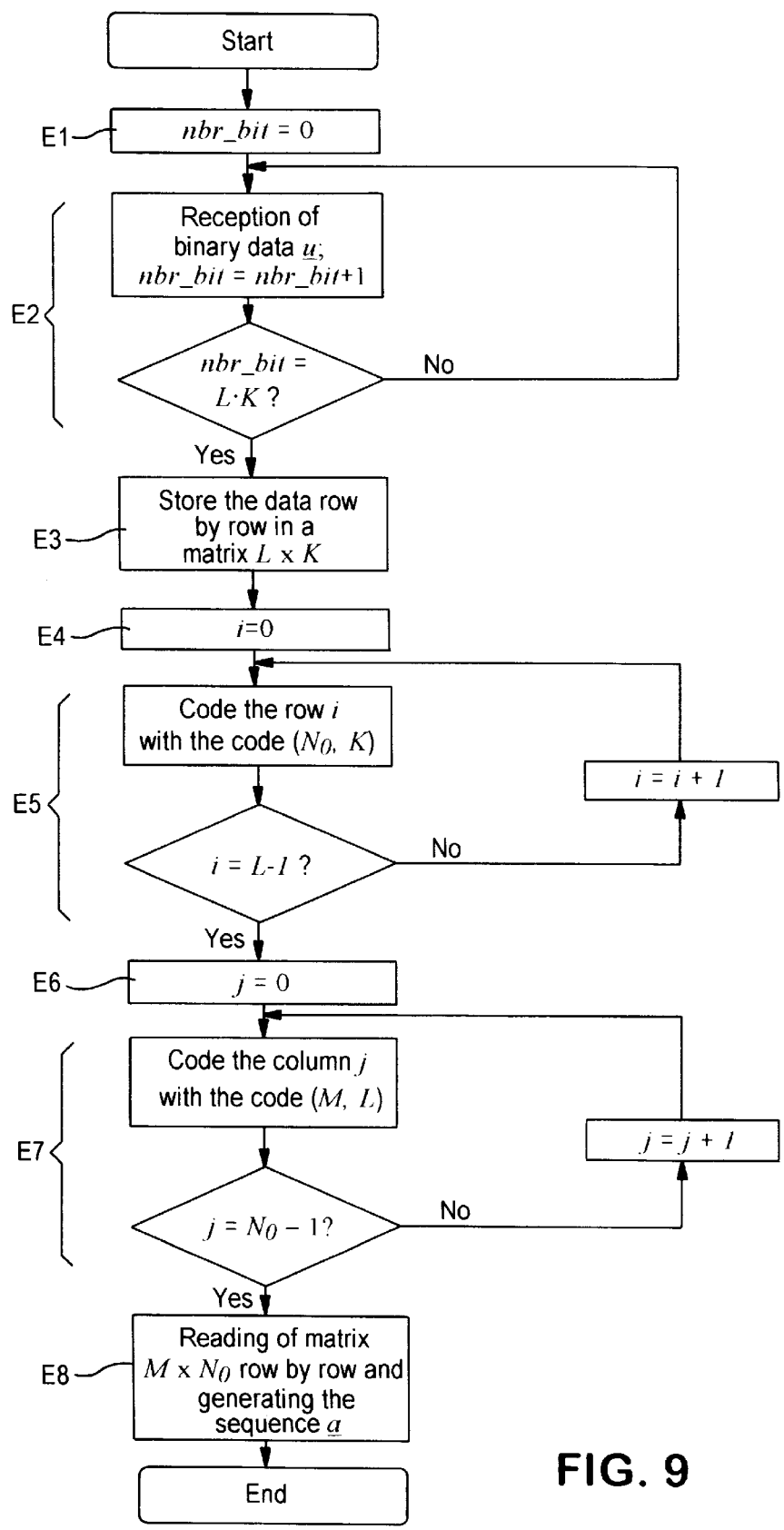
FIG. 9 depicts, schematically, an operating flow diagram of the external coder.

Likewise, FIG. 8 depicts a receiving electronic device, incorporating a turbodecoder 22. This device, substantially identical to the sender, has a conventional receiver 23, which sends the received signal to a turbodecoder 22, which supplies an input/output port 14. This input/output port 14 is also connected to a keyboard 15, to a storage device reader 16 and to a screen 25. The input/output port 14 is here also connected by a bus 17 of a conventional type to a central unit 18, to a non-volatile information storage device (ROM) 19 and to a volatile memory device 24 (RAM). The input/ output port 14, the bus 17, the central unit 18 and the storage devices 19, 20 are integrated into a computer casing of a conventional type. The input/output port 14 sends the information processed by the central unit 18 to an information destination 20.

It is clear that one and the same device can include both a sending part and a receiving part, the majority of the means being common to these two functions.

In particular, the non-volatile information storage device 19 of the receiving electronic device is read by the processor of the central unit 18.

According to a variant, the non-volatile information storage device 19 is removable, partially or totally, and is for example a magnetic tape, a floppy disk or a fixed-memory compact-disc (CD-ROM).

The non-volatile memory 19 of the receiving electronic device is adapted to store instructions of a computer program for implementing the method according to the invention and, particularly, the method of decoding data received over the transmission channel 3. In general terms, the volatile memory 24 contains data resulting from the implementation of the method according to the invention.

The formatting and external coding method is implemented by the central unit 18, using data previously stored in the non-volatile memory 19. This method is for example illustrated by the flow diagram in FIG. 9. It includes the following steps:

E1—setting the variable nbr_bit to zero,

E2—receiving the binary data $\underline{u}$ transmitted by the source 10, and incrementing the variable nbr_bit, so long as the variable nbr_bit is less than the product L x K, E3—storing the data row by row in a matrix of L rows and K columns, E4—setting the row number variable i, E5—coding the row i of the matrix with the code $(N_0, K)$ as long as the row number i is less than or equal to L−1, and incrementing the row number i, as long as the row number i is less than L−1, E6—setting the column number variable j to zero, E7—coding the column j of the matrix with the code (M, L) as long as the column number j is less than or equal to $N_0-1$, and incrementing the column number j, as long as the column number j is less than $N_0-1$, E8—reading the matrix M x $N_0$ row by row, and generating the sequence $\underline{a}$, sent to the turbocoder 12.

Figure 10:
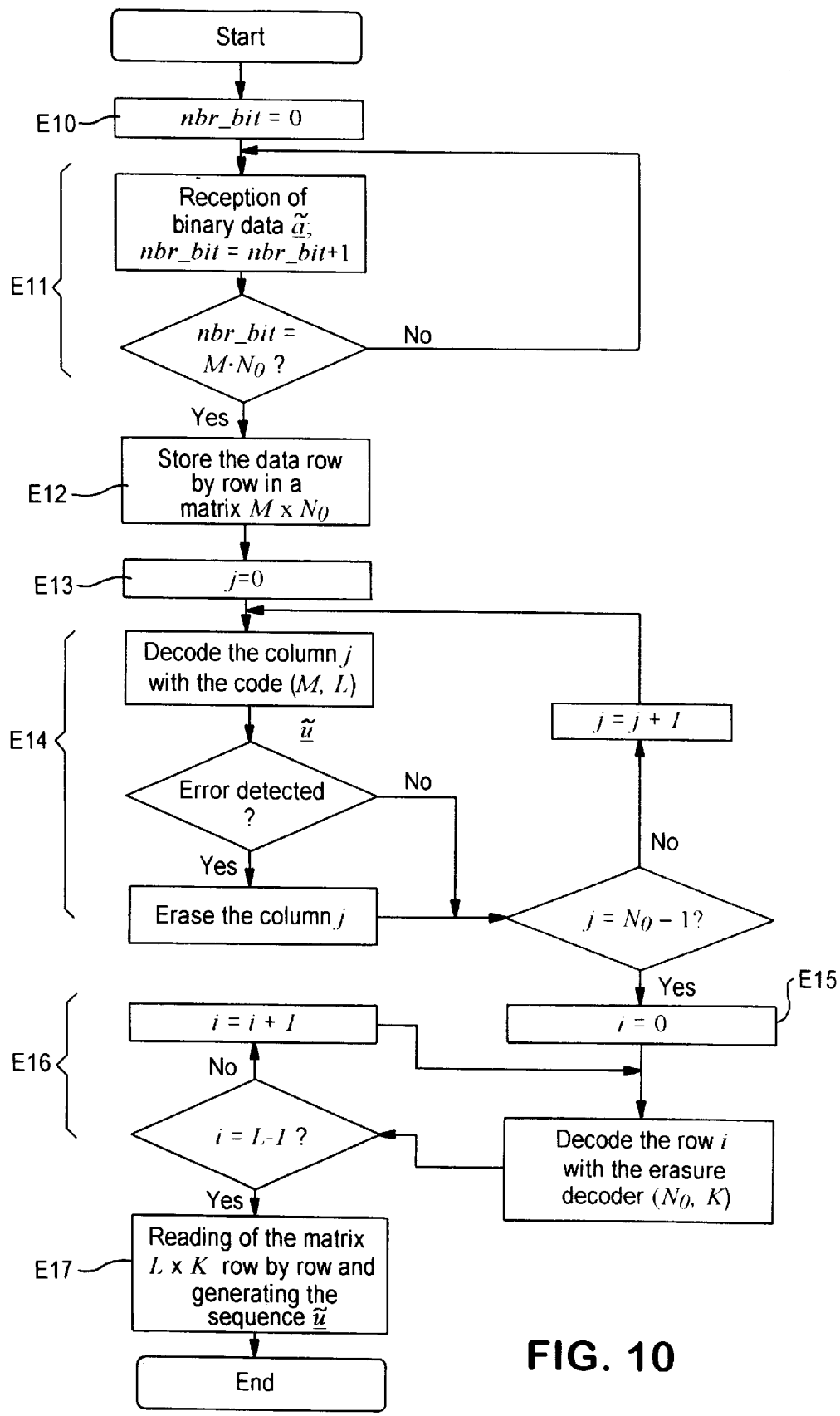
FIG. 10 depicts, schematically, an operating flow diagram of the external decoder

In a similar fashion, the operating flow diagram of the external decoder, illustrated by FIG. 10, includes the following steps:

E10—setting the variable nbr_bit to zero,

E11—receiving the binary data $\underline{\hat{a}}$ supplied by the turbodecoder 23, and incrementing the variable nbr_bit, so long as the variable nbr_bit is less than the product M x $N_0$, E12—storing the data row by row in a matrix of M rows and $N_0$ columns, E13—setting the column number variable to zero, E14—decoding the column j of the matrix with the code (M, L), erasure of the column j if an error is detected as long as the column number j is less than or equal to $N_0-1$, and incrementing the column number j, as long as the column number j is less than $N_0-1$, E15—setting the row number variable i to zero, E16—decoding the row i of the matrix with the erasure decoder $(N_0, K)$ as long as the row number i is less than or equal to L−1, and incrementing the row number i, as long as the row number i is less than L−1, E17—reading the matrix L x K row by row, and generating the sequence $\underline{u}$, sent to the destination 20.

In the embodiment described above, use was made, as the generator polynomial of the code (M, L), of the polynomial $g_1(y)=(1+y)(1+y+y^4)$. More generally, the error detection code (M, L) is produced using the generator polynomial $g_1(y)=(1+y) \cdot g_2(y)$, where $g_2(y)$ is a polynomial, of any degree, chosen so as to increase the detection capacity of said code (M, L).

Up to now a favoured meaning (by default) was chosen for the writing/reading and coding/decoding of the matrices. It is however evident that the implementation of the invention remains mainly identical if, in the entire disclosure above, all the columns are changed into rows and all the rows into columns. It is for example possible to write the binary data $\underline{u}$ column by column on a matrix of K rows and L columns, and to allocate a code $(N_0, K)$ to each column, etc.

It is quite clear that, in more general terms, the invention in fact uses a transmission method (and a formatting method and decoding method) executed vector by vector, the concept of vector being able to designate either a row or a column.

It will be understood that the invention applies, amongst other things, to a network, a computer, a video-camera, a facsimile machine, a photographic apparatus, a television receiver, a printer, a scanner or an audio/video player.

Naturally, the present invention is not limited to the details of embodiments described here by way of example, but on the contrary extends to any modifications within the capability of a person skilled in the art.

What is claimed is:

1. A method for transmitting binary data $\underline{u}$ from a sender to a receiver over a transmission channel using a turbocoder, comprising:

a precoding step of adding redundant information to the binary data $\underline{u}$, thus yielding binary data $\underline{a}$ which is then turbocoded, wherein the redundant information makes a transmission error occurred in the binary data $\underline{u}$ detectable, and also makes a polynomial representation of the precoded data $\underline{a}$ a multiple of a predetermined generator polynomial.

2. The method according to claim 1, wherein the sender uses a turbocoder with an "x to $x^e$" interleaver, and the receiver uses a turbodecoder with an "x to $x^e$" interleaver.

3. The method according to claim 1, further comprising the steps of:

storing the binary data $\underline{u}$ in an initial matrix U of L rows and K columns, L and K being predetermined; and allocating an error correction code $(N_0, K)$ to each row, thus forming an intermediate matrix U1.

4. The method according to claim 3, further comprising the step of allocating an error detection code (M, L) to each column in the intermediate matrix U1, thus forming a formatted matrix A.

5. The method according to claim 4, wherein the error detection code (M, L) is produced by adding at least one bit to each column of the intermediate matrix U1, and one of the added bits is calculated so as to ensure divisibility of the polynomial associated with each column in the formatted matrix A by $(1+y)$, where $y=x^{N_0}$, $N_0$ being the number of columns in the formatted matrix A.

6. The method according to claim 5, wherein the error detection code (M, L) is produced by using a generator polynomial $g_1(y)=(1+y)g_2(y)$, where $g_2(y)$ is a polynomial of any degree, chosen so as to increase the detection capacity of said code (M, L).

7. A method of formatting binary data for a transmission method according to claim 6, said formatting method being implemented by a central unit, using data (M, $N_0$, L, K) previously stored in a non-volatile memory 19, and comprising the steps of:

receiving binary data $\underline{u}$ transmitted by a source 10;

storing data row by row in an initial matrix U of L rows and K columns; and coding each row of the initial matrix U with the error correction code ($N_0$, K), forming an intermediate matrix U1.

8. The method according to claim 7, further comprising the steps of:

coding each column of the intermediate matrix U1 with the code (M,L), thus forming a formatted matrix A, of size M×$N_0$; and reading the matrix A row by row, and generating a sequence a, sent to the turbocoder 12.

9. Information storage means storing instructions of a computer program, characterized in that it implements the method according to claim 7.

10. Information storage means containing data resulting form the implementation of the method according to claim 7.

11. A method of decoding data received over a transmission channel, for a transmission method according to claim 5, said decoding method comprising the steps of:

receiving binary data $\tilde{a}$ supplied by a turbodecoder;

storing data row by row in a received matrix A' of M rows and $N_0$ columns; and decoding each column j of the received matrix A' with the code (M, L), and erasing the column j if an error is detected, thus forming a received intermediate matrix U1' of size L×$N_0$.

12. The decoding method according to claim 11, further comprising the steps of:

decoding each row i of the received intermediate matrix U1' with the decoder with erasures ($N_0$, K), thus forming a received final matrix U' of size L×K; and reading the received final matrix U' row by row, and generating the sequence û, sent to a destination.

13. Information storage means storing instructions of a computer program, characterized in that it implements the method of decoding data according to claim 11.

14. Information storage means containing data resulting form the implementation of the method of decoding data according to claim 11.

15. The method according to claim 3, wherein the error correction code ($N_0$, K) has a minimum distance (d) greater than a predetermined number, representing the number of correctable columns of the matrix.

16. Information storage means storing instructions of a computer program, characterized in that it implements the method of transmitting binary data according to claim 1.

17. A device for transmitting binary data $\underline{u}$ from a sender to a receiver over a transmission channel using a turbocoder, said device comprising:

precoding means for adding redundant information to the binary data $\underline{u}$, thus yielding binary data $\underline{a}$ which is then turbocoded, wherein the redundant information makes a transmission error occurred in the binary data $\underline{u}$ detectable, and also makes the polynomial representation of the precoded data $\underline{a}$ a multiple of a predetermined generator polynomial.

18. The device according to claim 17, wherein the sender has a turbocoder with an "x to $x^e$" interleaver, and the receiver has a turbodecoder with an "x to $x^e$" interleaver.

19. The device according to claim 17, further comprising:

means for storing binary data $\underline{u}$ in a matrix L rows and K columns, L and K being predetermined; and means for allocating an error correction code ($N_0$, K) to each row and an error detection code (M, L) to each column.

20. The device according to claim 17, having a central unit, a non-volatile memory, and a volatile memory, and further comprising:

means adapted to implement the following steps:
receiving binary data $\underline{u}$ transmitted by a source 10,
storing data row by row in a matrix of L rows and K columns, and
coding each row i of the matrix with a code ($N_0$, K).

21. The device according to claim 20, further comprising means adapted to implement the following steps:

coding the column j of the matrix with a code (M, L), and reading the matrix M×$N_0$ row by row, and generating the sequence $\underline{\tilde{a}}$, sent to a turbocoder.

22. A device for receiving data received over a transmission channel, for a transmission device according to claim 17, said receiving device having a central unit 18, a non-volatile memory 19, and a volatile memory 24, and further comprising means adapted to implement the following steps:

receiving binary data $\tilde{a}$ supplied by a turbodecoder, storing data row by row in a received matrix of M rows and $N_0$ columns, and decoding each column j of the received matrix with a code (M, L), and erasing the column j if an error is detected.

23. The device according to claim 22, further comprising means adapted to implement the following steps:

decoding the row i of the matrix with an erasure decoder ($N_0$, K), and reading the matrix L×K row by row, and generating the sequence û sent to a destination.

24. A telephone, having a device according to claim 17.

25. A photographic apparatus, having a device according to claim 17.

26. A printer, having a device according to claim 17.

27. A scanner, having a device according to claim 17.

28. A video camera, having a device according to claim 17.

29. A computer, having a device according to claim 17.

30. A facsimile machine, having a device according to claim 17.

31. A television receiver, having a device according to claim 17.

32. An audio/video player, having a device according to claim 17.

* * * * *

UNITED STATES PATENT AND TRADEMARK OFFICE
CERTIFICATE OF CORRECTION

PATENT NO.         : 6,578,171 B1
APPLICATION NO.    : 09/500425
DATED              : June 10, 2003
INVENTOR(S)        : Mohamed Braneci et al.

It is certified that error appears in the above-identified patent and that said Letters Patent is hereby corrected as shown below:

COLUMN 1

Line 30, ""turbodecode"." should read --"turbodecoder".--; and "convenience." should read --convenience:--.

COLUMN 2

Line 3, "symbols a" should read --symbols u--; and
Line 13, "(preceding)" should read --(precoding)--.

COLUMN 4

Line 18, "column" should read --column.--.

COLUMN 5

Line 43, "$N_o=7$" should read --$N_o=7$),--.

COLUMN 6

Line 48, "their" should read --there--.

COLUMN 7

Line 15, " $a(x) = \sum_{j=0}^{NO+1} c_j(y) \cdot x^j$ " should read -- $a(x) = \sum_{j=0}^{NO-1} c_j(y) \cdot x^j$ --.

COLUMN 8

Line 37, "conventiorial" should read --conventional--.

COLUMN 9

Line 58, "variable" should read --variable $j$--.

UNITED STATES PATENT AND TRADEMARK OFFICE
CERTIFICATE OF CORRECTION

PATENT NO. : 6,578,171 B1
APPLICATION NO. : 09/500425
DATED : June 10, 2003
INVENTOR(S) : Mohamed Braneci et al.

It is certified that error appears in the above-identified patent and that said Letters Patent is hereby corrected as shown below:

COLUMN 10

Line 4, "u," should read --û--; and
Line 11, "favoured" should read --favored--.

Signed and Sealed this

Sixteenth Day of September, 2008

JON W. DUDAS
*Director of the United States Patent and Trademark Office*